(12) United States Patent
Zimmerman

(10) Patent No.: US 7,933,968 B1
(45) Date of Patent: Apr. 26, 2011

(54) TOKEN-BASED PERSONALIZATION OF SMART APPLIANCES

(75) Inventor: John Zimmerman, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 1045 days.

(21) Appl. No.: 09/597,196

(22) Filed: Jun. 20, 2000

(51) Int. Cl.
*G06F 15/16* (2006.01)
*G06F 15/177* (2006.01)

(52) U.S. Cl. ......... 709/217; 709/219; 709/220; 709/221

(58) Field of Classification Search .................. 709/217, 709/219–221, 229, 222; 715/735, 744, 747; 725/39, 46, 47
See application file for complete search history.

(56) References Cited

U.S. PATENT DOCUMENTS

| | | | | |
|---|---|---|---|---|
| 5,710,884 A | * | 1/1998 | Dedrick | 709/217 |
| 5,745,554 A | * | 4/1998 | Rozetti | 379/91.02 |
| 5,771,381 A | * | 6/1998 | Jones et al. | 713/100 |
| 5,793,963 A | * | 8/1998 | Tapperson et al. | 709/201 |
| 5,793,972 A | * | 8/1998 | Shane | 709/219 |
| 5,822,565 A | * | 10/1998 | DeRosa et al. | 703/24 |
| 5,838,907 A | * | 11/1998 | Hansen | 709/220 |
| 5,974,454 A | * | 10/1999 | Apfel et al. | 709/221 |
| 5,983,273 A | * | 11/1999 | White et al. | 709/229 |
| 5,991,773 A | * | 11/1999 | Tagawa | 707/203 |
| 6,009,410 A | * | 12/1999 | LeMole et al. | 705/14 |
| 6,012,088 A | * | 1/2000 | Li et al. | 709/219 |
| 6,026,438 A | * | 2/2000 | Piazza et al. | 709/221 |
| 6,029,196 A | * | 2/2000 | Lenz | 709/221 |
| 6,038,551 A | * | 3/2000 | Barlow et al. | 705/41 |
| 6,044,349 A | * | 3/2000 | Tolopka et al. | 705/1 |
| 6,078,928 A | * | 6/2000 | Schnase et al. | 707/104.1 |
| 6,081,793 A | * | 6/2000 | Challener et al. | 705/50 |
| 6,088,722 A | * | 7/2000 | Herz et al. | 709/217 |
| 6,091,518 A | * | 7/2000 | Anabuki | 358/500 |
| 6,098,098 A | * | 8/2000 | Sandahl et al. | 709/221 |
| 6,105,063 A | * | 8/2000 | Hayes, Jr. | 709/223 |
| 6,119,234 A | * | 9/2000 | Aziz et al. | 726/11 |
| 6,139,177 A | * | 10/2000 | Venkatraman et al. | 700/83 |
| 6,161,133 A | * | 12/2000 | Kikinis | 709/220 |
| 6,161,134 A | * | 12/2000 | Wang et al. | 709/220 |
| 6,163,316 A | * | 12/2000 | Killian | 345/721 |
| 6,199,099 B1 | * | 3/2001 | Gershman et al. | 709/203 |
| 6,199,114 B1 | * | 3/2001 | White et al. | 709/229 |
| 6,205,476 B1 | * | 3/2001 | Hayes, Jr. | 709/220 |
| 6,226,744 B1 | * | 5/2001 | Murphy et al. | 726/5 |

(Continued)

FOREIGN PATENT DOCUMENTS

DE     19713271 A     10/1998

(Continued)

*Primary Examiner* — Kristie D Shingles

(57) ABSTRACT

A radio frequency identification (RFID) token is used with appliances to access profile data to personalize the appliance. Each token contains a pointer to a relay location on a network with a further pointer indicating a profile location where user-profile data is stored. When a user wants to use an appliance, he/she places the token near the appliance and the appliance accesses the data from the site indicated (pointed to) by the relay location. The profile location may contain many different types of data such as speed dial lists, media preferences, preferred product classifications, etc. The appliance could obtain just the information it required, for example if the database were XML-tagged, by filtering out irrelevant content and personalize itself accordingly. When multiple users wish to use a single appliance, for example a television, each may place his/her token near the appliance and the appliance may then combine relevant profile data accordingly to develop a single composite profile to use to personalize the appliance.

9 Claims, 9 Drawing Sheets

U.S. PATENT DOCUMENTS

| | | | |
|---|---|---|---|
| 6,233,566 B1 * | 5/2001 | Levine et al. | 705/36 R |
| 6,256,019 B1 * | 7/2001 | Allport | 345/169 |
| 6,256,635 B1 * | 7/2001 | Arrouye et al. | 707/102 |
| 6,282,522 B1 * | 8/2001 | Davis et al. | 705/41 |
| 6,282,569 B1 * | 8/2001 | Wallis et al. | 709/224 |
| 6,286,038 B1 * | 9/2001 | Reichmeyer et al. | 709/220 |
| 6,370,141 B1 * | 4/2002 | Giordano et al. | 370/386 |
| 6,375,469 B1 * | 4/2002 | Brown | 434/236 |
| 6,385,651 B2 * | 5/2002 | Dancs et al. | 709/227 |
| 6,400,272 B1 * | 6/2002 | Holtzman et al. | 340/572.1 |
| 6,446,076 B1 * | 9/2002 | Burkey et al. | 707/102 |
| 6,493,751 B1 * | 12/2002 | Tate et al. | 709/221 |
| 6,557,032 B1 * | 4/2003 | Jones et al. | 709/220 |
| 6,587,873 B1 * | 7/2003 | Nobakht et al. | 709/219 |
| 6,615,353 B1 * | 9/2003 | Hashiguchi | 713/185 |
| 6,637,029 B1 * | 10/2003 | Maissel et al. | 725/46 |
| 6,643,701 B1 * | 11/2003 | Aziz et al. | 709/227 |
| 6,684,241 B1 * | 1/2004 | Sandick et al. | 709/220 |
| 6,697,837 B1 * | 2/2004 | Rodov | 709/203 |
| 6,715,075 B1 * | 3/2004 | Loukianov | 713/176 |
| 6,738,901 B1 * | 5/2004 | Boyles et al. | 713/159 |
| 6,757,723 B1 * | 6/2004 | O'Toole et al. | 709/222 |
| 6,760,761 B1 * | 7/2004 | Sciacca | 709/220 |
| 6,775,368 B1 * | 8/2004 | Lee et al. | 379/211.02 |
| 6,778,096 B1 * | 8/2004 | Ward et al. | 713/1 |
| 6,795,923 B1 * | 9/2004 | Stern et al. | 726/12 |
| 6,822,971 B1 * | 11/2004 | Mikkonen | 370/475 |
| 6,839,744 B1 * | 1/2005 | Kloba et al. | 709/219 |
| 6,862,612 B1 * | 3/2005 | Horn et al. | 709/219 |
| 6,868,433 B1 * | 3/2005 | Philyaw | 709/203 |
| 6,871,221 B1 * | 3/2005 | Styles | 709/221 |
| 6,892,196 B1 * | 5/2005 | Hughes | 1/1 |
| 6,912,578 B1 * | 6/2005 | Hanko et al. | 709/227 |
| 6,934,841 B2 * | 8/2005 | Boyles et al. | 713/159 |
| 6,934,855 B1 * | 8/2005 | Kipnis et al. | 726/20 |
| 6,938,089 B1 * | 8/2005 | Slaby et al. | 709/229 |
| 6,944,650 B1 * | 9/2005 | Urien | 709/217 |
| 6,957,776 B1 * | 10/2005 | Ng | 235/474 |
| 7,010,701 B1 * | 3/2006 | Bossemeyer et al. | 711/173 |
| 7,036,738 B1 * | 5/2006 | Vanzini et al. | 235/486 |
| 7,076,504 B1 * | 7/2006 | Handel et al. | 707/104.1 |
| 7,111,051 B2 * | 9/2006 | Nobakht et al. | 709/217 |
| 7,127,735 B1 * | 10/2006 | Lee et al. | 725/87 |
| 7,630,986 B1 * | 12/2009 | Herz et al. | 1/1 |
| 7,672,879 B1 * | 3/2010 | Kumar et al. | 705/30 |
| 2001/0039583 A1 * | 11/2001 | Nobakht et al. | 709/227 |
| 2001/0045451 A1 * | 11/2001 | Tan et al. | 235/375 |
| 2001/0047426 A1 * | 11/2001 | Hunter | 709/238 |
| 2002/0049852 A1 * | 4/2002 | Lee et al. | 709/231 |
| 2002/0055847 A1 * | 5/2002 | Nakano et al. | 705/1 |
| 2002/0099634 A1 * | 7/2002 | Coutts et al. | 705/35 |
| 2002/0165773 A1 * | 11/2002 | Natsuno et al. | 705/14 |
| 2003/0018558 A1 * | 1/2003 | Heffner et al. | 705/37 |
| 2003/0033534 A1 * | 2/2003 | Rand et al. | 713/185 |

FOREIGN PATENT DOCUMENTS

GB 2325537 A 11/1998

* cited by examiner

TOKEN-BASED PERSONALIZATION OF SMART APPLIANCES

BACKGROUND OF THE INVENTION

1. Field of the Invention

The invention relates to appliances whose user interfaces can be made less complicated through the use of personal preference, or profile, data. More particularly, the invention relates to the use of a physical token or tag that indicates the identity of the user and mechanisms by which profile data may be obtained from a store accessible via a network.

2. Background

Many modern appliances such as televisions, telephones, computers, etc. are capable of providing such a large array of options that a demand exists for devices that allow them to be personalized to make them easier to use. An example is set top boxes that provide personalized electronic program guides (EPGs). These can be personalized either actively, by specifying rules for selecting or filtering out programming; or passively, by allowing the set top box to extract rules from use over an extended period of time. Another very simple example of a personalized appliance is a telephone speed dial directory. Still another example of a personalized appliance is a desktop computer, whose applications usually allow a large variety of personal settings to be established to customize the working environment.

A first drawback with many such appliances is the lack of an ability to store multiple profiles in an appliance. In addition, if a new appliance is purchased, rented, or used (such as during a visit to another's residence) the personal data generated by one appliance is not available for use with another appliance.

A second drawback with the above personalization approach is the fact that each of multiple users of a single appliance may employ divergent criteria for selecting features. These may conflict as when personalizing a user interface of a computer. Alternatively they may expand the option space so much that the benefits of personalization are diminished as when each member of a family make personalization contributions to a television EPG or a speed dial list. In the example of an EPG, one family member's selection of documentaries, another's selection of sitcoms, and another's selection of sports contributes to the expansion of the selection space to something that is nearly as impersonal as an unpersonalized EPG.

One attempt to overcome the first of the foregoing difficulties in the particular environment of an Internet terminal is the use of smart cards to store the personal identification data. An example of such a solution is described in U.S. Pat. No. 5,983,273. The above patent describes a system in which a smart card containing a unique identifier is inserted in a set top box. Information on the smart card is transmitted to an internet server and in response the server downloads to the set top box information particular to the user associated with the smart card to configure the set top box. The interaction between the card, terminal (set top box) and server may provide for authentication. The information delivered by the server includes filtering information for viewing web sites, access privilege data in the form of a ticket, and favorites lists. The ticket is used to invoke permissions at web sites and provide for at least one customized response. The specification describes sending the user's email, favorite links, titles in a URL, and thumbnails in response to the ticket.

Another patent DE 197 13 271 briefly describes a client-server system in which a transponder is used to classify a user and the services delivered to the client customized based on information specific to the user or user-class. This can address the second of the drawbacks be causing the appliance to switch to a different personalization depending on the user.

Another patent GB 2 325 537 addresses the second of the drawbacks in the area of EPG applications. In this application, each user in a group, such as a family, identifies himself/herself as a current user. Separate profiles are developed by each user. Then, when multiple users watch the television together, their profiles are, selectively, either logically ANDed or logically ORed to produce a new profile that is then used to filter the EPG.

The prior art techniques solve some of the difficulties of adapting appliances, but there is a need to make it easier for a user to personalize an appliance and to transfer information about preferences from one appliance to another. In addition, there is a need to make it easier and more convenient to combine the profiles of multiple users. Furthermore, the mechanisms for providing such convenience must be such that manufacturers can provide them without having to support complex service infrastructures such as required by the smart card system described in U.S. Pat. No. 5,983,273.

SUMMARY OF THE INVENTION

Briefly, a radio frequency identification (RFID) token is used with appliances to access profile data to personalize the appliance. Each token contains a pointer to a relay location on a network with a further pointer indicating a profile location where user-profile data is stored. When a user wants to use an appliance, he/she places the token near the appliance and the appliance accesses the data from the site indicated (pointed to) by the relay location. The profile location may contain many different types of data such as speed dial lists, media preferences, preferred product classifications, etc. The appliance could obtain just the information it required, for example if the database were XML-tagged, by filtering out irrelevant content and personalize itself accordingly. When multiple users wish to use a single appliance, for example a television, each may place his/her token near the appliance and the appliance may then combine relevant profile data accordingly to develop a single composite profile to use to personalize the appliance.

A component of the invention is an RFID tag or token or any suitable device capable of storing identification, authorization, and/or authentication data. Each RFID device contains a unique Internet uniform resource locator {URL} called the relay location. The relay location URL stores a profile URL that is owned and maintained by and/or for the user. A manufacturer of the device could supply them with new set top boxes, telephones, televisions, computers, or other appliances. The user may maintain his/her personal data at a location—a profile server—that is independent of the relay location, which corresponds to the token only.

The token or device may simply be placed near the smart appliance while the user is using it. The device may be required to be placed close to the appliance or it could be permitted to work in a field that is a substantial radius, say several meters, as in a Bluetooth® network. If the device is used in a physical setup where a user may leave the vicinity of the appliance for a period of time and then return and it would be disruptive to have the profile removed during that interval, the appliance could provide a persistence period option. Thus, the user could indicate the length of the maximum interval after which the non-presence of the device should indicate that he/she is no longer a current user. This could be useful in situations where many people are simultaneously using an appliance. For example, when one member of the family gets up to make some popcorn, it would be undesirable for that user's profile data to be removed from the pool. To prevent transient occupants from being added to the user group, the detection of a token would not cause the addition of a user to a group unless confirmed or authenticated. Thus, the appliance could request confirmation that a new occupant confirm that he/she should be added to the user group.

Alternatively, the devices could be required to be placed right near the appliance. In this scenario, each user would leave his token or device on top of or near the appliance while he/she is expected to remain an active member of a group of users. This would have the advantage of preventing inadvertent addition of transient occupants of the room being added to the user group.

When the token establishes a link with a smart appliance, it conveys the relay URL and an identifier of the token. The smart appliance accesses the relay URL, which responds by transmitting the profile URL. The smart appliance then attempts to link with the profile URL. For security, the token may provide data identifying the token as well as the relay location URL and the smart appliance may be required to transmit this identifier to be authorized to link with the profile location. With this authorization requirement, if a user lost his/her RFID device, he/she could indicate the loss of the device to the profile destination. Subsequent attempts to use the device could then be unauthorized. Thus, another user attempting to access the first user's data would fail the authorization and be unable to access the profile data. Alternatively, authorization could be handled through the relay location server. In this case, the lost device or token could be reported to the supervisor of the relay server, which could then no longer transmit the profile URL in response to service requests from the lost device. Alternatively, the relay URL could simply be discontinued for all time or reused by coupling it to a new secondary authentication tag. The latter may be implemented by having the relay server require an authentication code from the device before returning the profile URL. Still another alternative is to provide security at both the relay server and the profile server.

Returning to the use scenario, assuming a link has been established between the smart appliance and the profile server, the user(s) may be prompted to enter a PIN number or some other authentication device to allow the profile to be used. The user may enter the authentication information on the appliance or via the RFID device itself. Thus, the tag could be provided with a small user interface allowing input and display of data.

The appliance could continuously poll its vicinity to determine the constitution of the current group of users. If the group has changed, the appliance may take appropriate action. The token may be a radio terminal, a transponder, an RFID tag, or any other kind of device that is able to transmit data wirelessly. If the device has its own power source, the appliance would not have to poll for new devices.

As the constitution of a user group changes, the appliance may provide information about the combined profile so that the group can make adjustments or reconcile conflicts. Profiles will inevitably contain imperfect information and methods for reconciling them may always be limited to some extent. Thus, for example, the non-presence of sitcoms in one user's profile could indicate indifference or antipathy. The mechanism for reconciling may be limited to simple logical operations such as union or intersection of sets of rules. Presenting feedback on the combined profile and how it was created could allow the users to create a more intelligent reconciliation. A user interface to support such an interactive reconciliation may display all the categories of favored material from the various profiles and allow the user(s) to select from among them. For example, in the above case where a user profile did not contain sitcoms, the group might select that category if the one user was indifferent or might deselect them if the user strongly disfavored that category of material.

If a user leaves a group and his/her profile is withdrawn, the appliance may be programmed to determine whether the combined-profile space has changed sufficiently as to suggest a change to the current group. For example, suppose the only person that disfavors sports leaves the group leaving only sports-lovers behind. The current compromise of sitcoms resulting from an intersection of the profiles of the earlier group could be drastically altered generating much stronger matches with the now-current group preferences. So in this case, the appliance (e.g., television) would suggest new programming for the group to consider.

Combining profiles need not be a constant homogenized solution space. It is possible for a single group, which is planning to watch TV for a period of, say two hours, to compromise in a time-dependent way that maximizes the value for all members. Suppose the combination of profiles suggests highly preferred programming for one member or subgroup during the first hour and highly valued programming for another member or subgroup during the second hour. If the appliance knew the time during which the group would use the appliance together, it could make use of that information to allow selections to be made that would segregate the high value selections in time. The result would be that one member would get to see his/her most preferred programming during a first interval while another would get to see his/her most preferred programming during a second interval.

When a consumer buys an appliance, multiple RFID devices may be shipped with it. Alternatively, a single device may be shipped with a new appliance and further devices purchased when and if required. If the devices are to be used with multiple types of appliances or even multiple appliances made by multiple manufacturers, there may be a communications protocol standard that all would adopt. Alternatively, different protocols may be used by different manufacturers and each appliance built to recognize and interact with the devices of other manufacturers. If multiple devices are shipped with a product, to prevent wasted resources in the relay server, a user is required to register his/her device. The user logs onto the relay server, authorizes him/herself as a valid user, and enters the profile URL. The user can always change or update this URL, but the resources required for each user is very small so that many users can be serviced with a very small storage space. Also, to minimize contact with the relay server, appliances can be programmed to persist the profile data or the URL data for a period of time before the data is expired. Preferably this data is never revealed unless via a secure interface, so storage on the appliance should not present a privacy problem.

The invention contemplates a private profile database. According to one feature of the invention, each appliance may contribute information to this database. The prior art contains various descriptions of systems that adapt to user preferences by observing user-interaction with the appliance. For example, by observing a user's programming choices over time, an EPG set top box can derive rules and use these to personalize the EPG in the future. This profile data may be uploaded by the appliance to the user's personal profile server. Preferably, the data format would be standardized across multiple classes of appliances, but this is not essential. For example, the data could be XML-tagged and stored ad hoc, allowing various devices to make sense of it through the tagging.

As described above, the invention provides, among other things, the ability to "move" profile or preference data among various appliances. It also provides the ability to associate the profile or preference data with a physical object rather than something that must be memorized, like a URL. It further provides a simple, fast, convenient mechanism for identifying a user without requiring data entry through a user interface. It still further provides the ability for an ad hoc group to be defined and indicated to an appliance and have multiple user profiles merged thereby. Still further, it provides the ability for a manufacturer to provide a key to the supporting service infrastructure without requiring the manufacturer to support the bulk of the necessary data. The latter feature has the advantage of permitting devices for making the user's data more secure and private.

The invention will be described in connection with certain preferred embodiments, with reference to the following illustrative figures so that it may be more fully understood. With reference to the figures, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

DETAILED DESCRIPTION OF THE PREFERRED EMBODIMENTS

Figure 1:
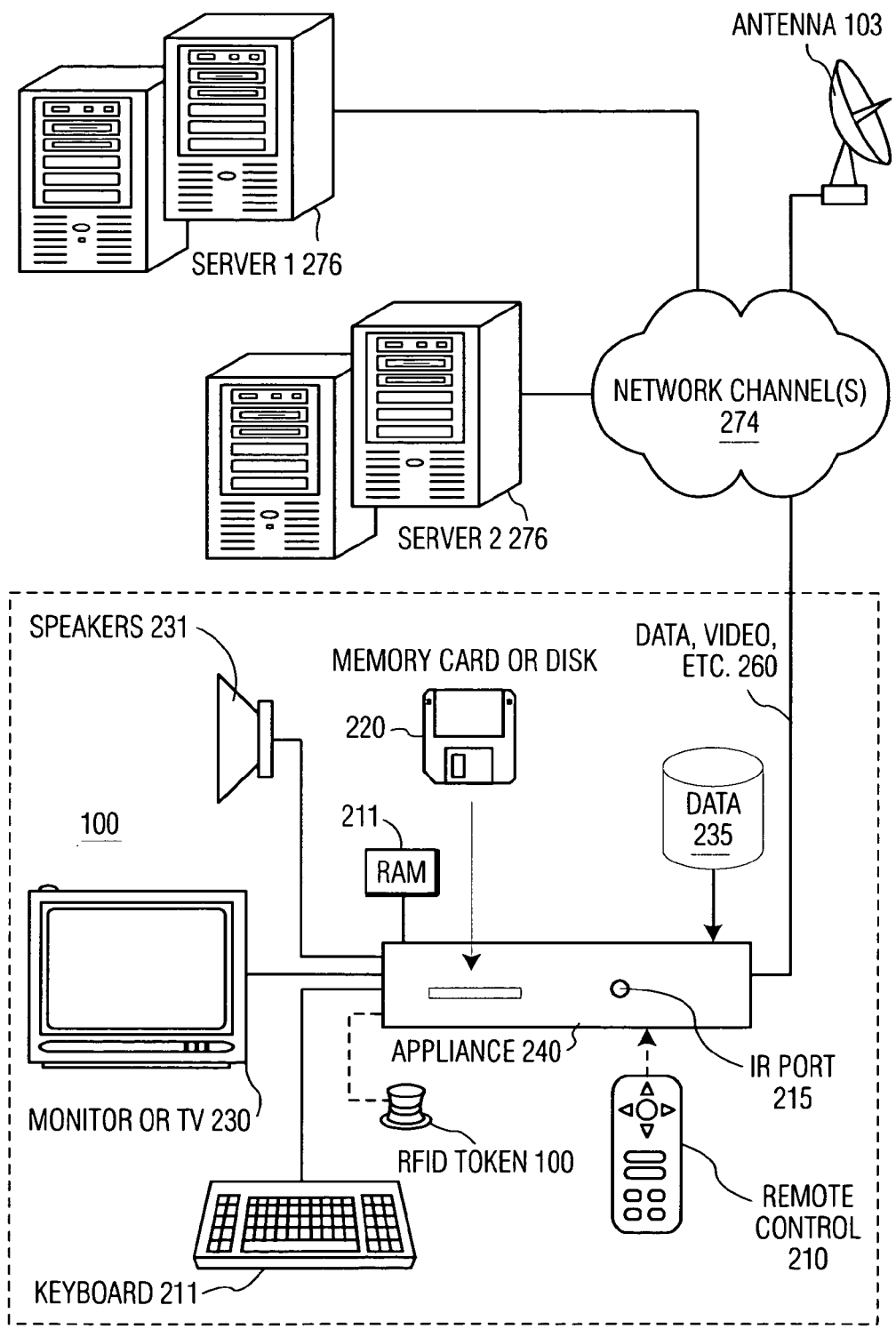
FIG. 1 is a schematic illustration of a system in which in the invention may be advantageously applied.

Referring to FIG. 1, the invention will be described in the environment of an electronic program guide (EPG) for a home television system. In an embodiment, a computer (or "set-top box") 240 displays program information on a television or monitor 230. The computer 240 may be equipped to receive a video signal 260 and control a channel-changing function as well as accept search queries through user input devices such as a keyboard 211 or handheld remote control 210. The EPG can be browsed based on simple criteria such as a default filter (such as current time of day) as well as queried using a search engine process. The computer 240 may also be programmed to allow a user to select channels through a tuner (not shown) inside the computer 240 rather than through a television's tuner (not shown). The user can then select a program to be viewed by highlighting a desired selection from a displayed program schedule using a remote control 210 to control the computer. The computer 240 has a data link 260 through which it can receive updated program schedule data. This could be a telephone line connectable to an Internet service provider or some other suitable data connection. The computer 240 has a mass storage device 235, for example a hard disk, to store program schedule information, program applications and upgrades, and other information. Information about the user's preferences and other data can be uploaded into the computer 240 via removable media such as a memory card or disk 220. Alternatively, information may be obtained from a transponder such as an RFID token or device 100.

Figure 2A:
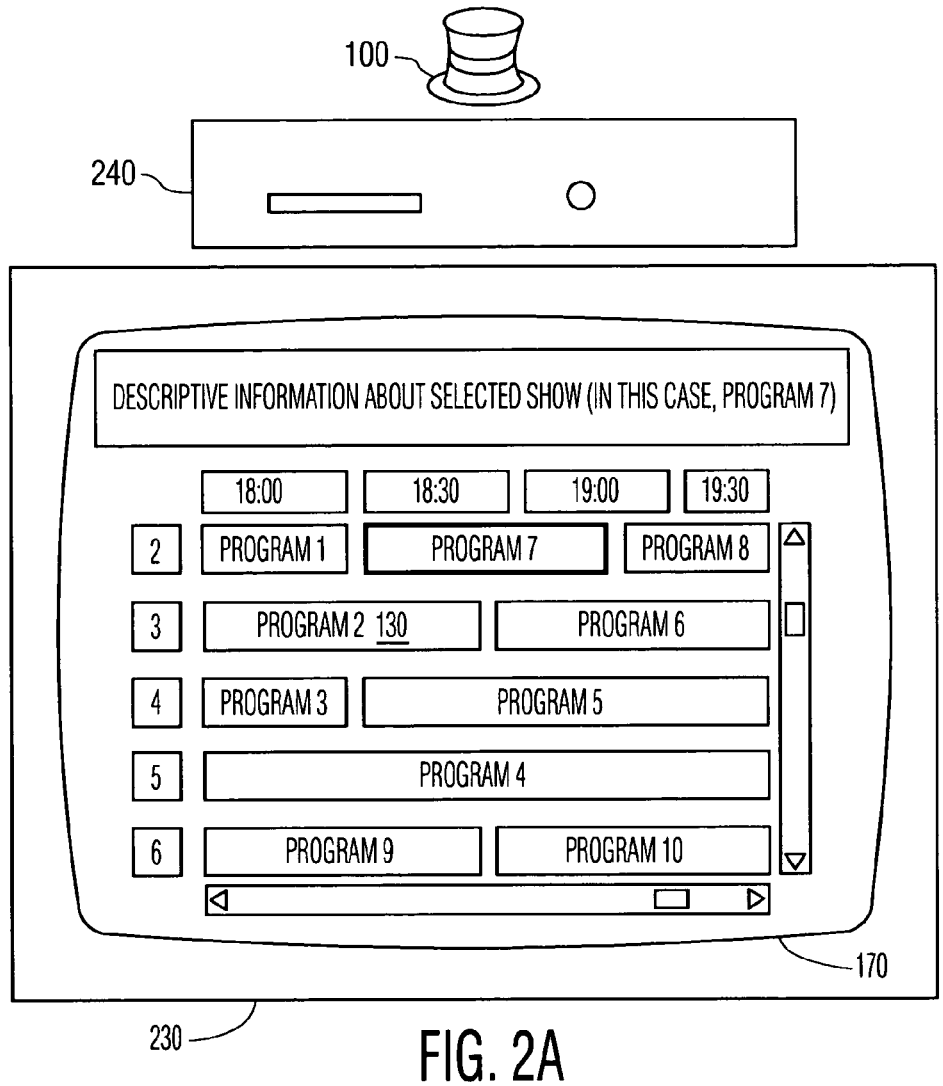
FIG. 2A is an illustration of a television with a set top box generating an electronic program guide in which the invention may be used.
Figure 2B:
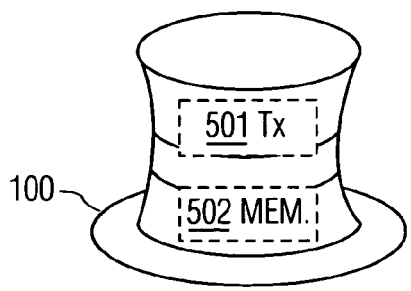
FIG. 2B is an illustration of an RFID token according to an embodiment of the invention.
Figure 3:
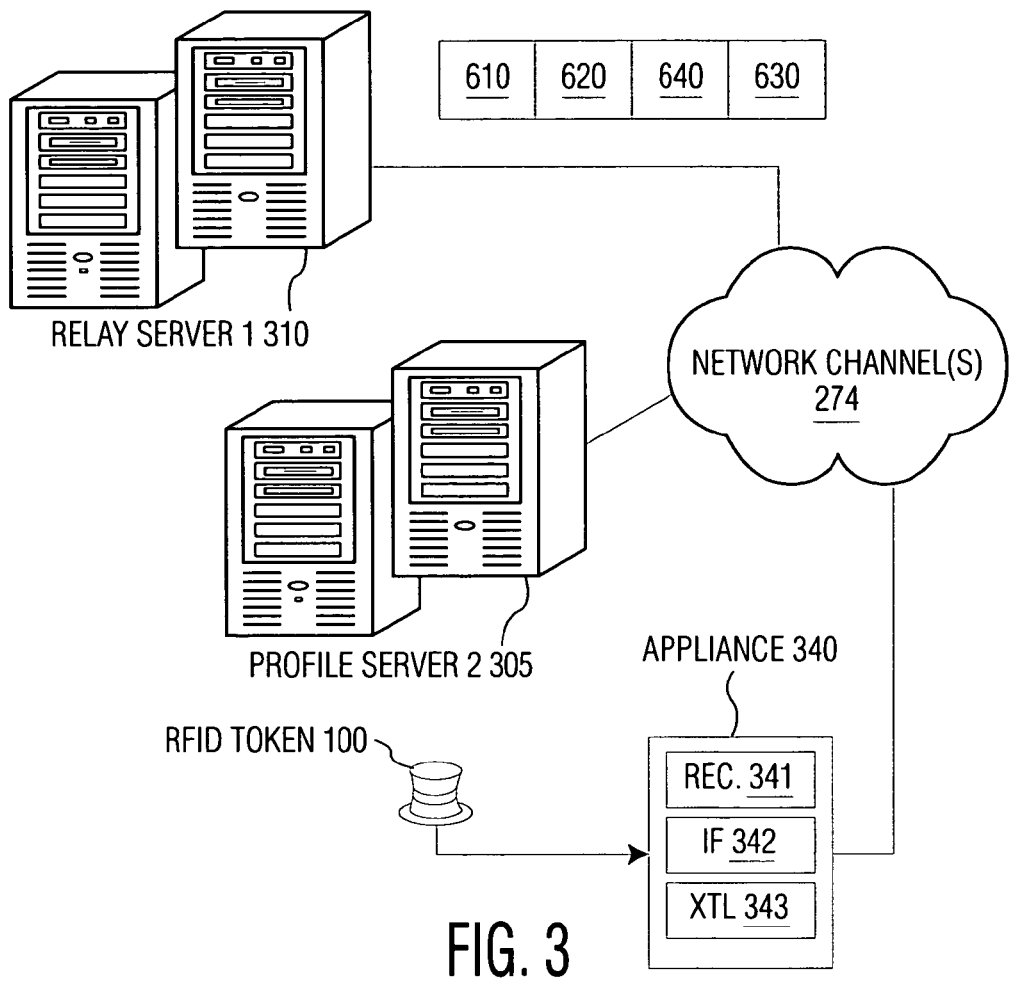
FIG. 3 is an illustration of a set of connections used by an appliance to obtain profile data according to an embodiment of the invention.
Figure 4:
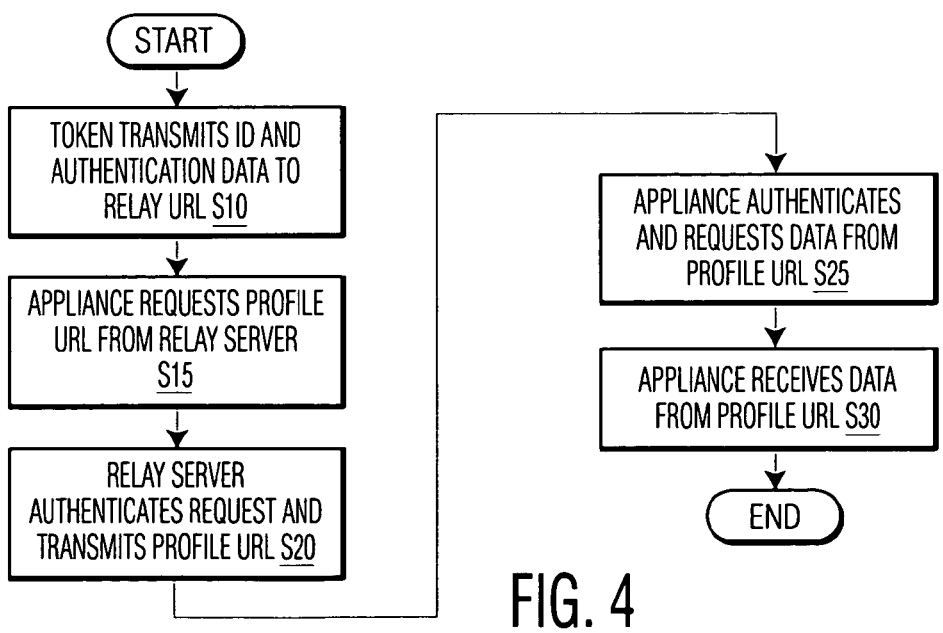
FIG. 4 is a flow chart indicating a procedure for obtaining profile data according to an embodiment of the invention.

EPG data may include titles and various descriptive information such as a narrative summary, various keywords categorizing the content, etc. These may be searchable as full text through a suitable user interface (UI). Referring now also to FIG. 2, the program information can be shown to the user and browsed by the user. The attendant display may be in the form of a time-grid 170 similar to the format commonly used for existing cable television channel guides. In the time-grid display 170, various programs are shown such as indicated by the bar at 130. The length of each bar indicates a respective program's duration and the start and end points of each bar indicate the start and end times, respectively, of each respective program. A description window may be provided to show detailed information about a currently selected program.

Content may be supplied from Internet servers 276 a satellite receiver 103 via any type of network 274 including radio, cable, optical, twisted pair or other metallic wiring. The content can be delivered as digital or analog signals.

Note that many substitutions are possible in the above example hardware environment and all can be used in connection with the invention. The mass storage can be replaced by volatile memory or non-volatile memory. The data can be stored locally or remotely. In fact, the entire computer 240 could be replaced with a server operating offsite through a link. Rather than using a remote control to send commands to the computer 240 through an infrared port 215, the controller could send commands through a data channel 260 which could be separate from, or the same as, the physical channel carrying the video. The video or other content can be carried by a cable, RF, or any other broadband physical channel or obtained from a mass storage or removable storage medium. It could be carried by a switched physical channel such as a phone line or a virtually switched channel such as ATM or other network suitable for synchronous data communication. Content could be asynchronous and tolerant of dropouts so that present-day IP networks could be used. Further, the content of the line through which programming content is received could be audio, chat conversation data, web sites, or any other kind of content for which a variety of selections are possible. The program guide data can be received through channels other than the separate data link 260. For example, program guide information can be received through the same physical channel as the video or other content. It could even be provided through removable data storage media such as memory card or disk 220. The remote control 210 can be replaced by a keyboard, voice command interface, 3D-mouse, joystick, or any other suitable input device. Selections can be made by moving a highlighting indicator, identifying a selection symbolically (e.g., by a name or number), or making selections in batch form through a data transmission or via removable media.

Referring now to FIGS. 2A, 2B, 3, and 4, the RFID token 100 has a non-volatile internal memory 502 for storing data and a transmitter 501. The token 100 has been placed near the appliance 240 which, as in FIG. 1, may be a set top box or any other appliance indicated as a general appliance 340 in FIG. 3. This permits the appliance 340 and the RFID to establish a communications link momentarily such as to allow the RFID token 100 to transmit its relay URL information, and optionally, authentication data to the appliance 340. This occurs in step S10 of FIG. 4. Then, in step S15 the appliance 340 accesses the relay URL in a message that contains, optionally, information identifying the particular token and/or authentication information to authorize the relay server 310 to provide the profile URL data. In step S20, the relay server 310 may authenticate the request and then look up and transmit, back to the appliance 340, the location of the profile data. In step S25, the appliance 340 generates a request to the profile server 305 which may optionally contain authentication/authorization data. Finally, in step 30, the profile data is returned. Note that profile data may be obtained in a multistep process whereby the appliance interrogates the profile database to determine the data that is available or alternatively, the appliance 340 may indicate to the profile server 305 the type of data required or the nature of the appliance, and the profile server 305 will transmit the relevant data. Another alternative is for the profile server 305 to package the data in a format requested by the appliance.

The servers, represented generally by the box at 630 may be standard network devices having a network interface 620, a memory 640, and a controller 610.

Note that instead of URLs, the location data can be provided in the form of IP addresses or any other suitable addressing mechanism permitting the location of data or processes on a network. The profile location may contain many different types of data such as speed dial lists, media preferences, preferred product classifications, etc. Note that the appliance 340 could obtain all the information in the profile database or just the information it requires. For example if the database were XML-tagged, the appliance 340 could filter out irrelevant content and personalize itself accordingly. Note also that features of the invention may be implemented using smart cards or other physical media, transponders, communications devices, etc. For example, the relay URL could be contained in a Bluetooth compatible cell phone, PDA, or even a piece of flash media or a disk. Preferably, however, it is desirable for the device to be cheap and capable of being transported everywhere.

An alternative implementation of the RFID is to have the RFID data installed in multiple devices, one of which is likely to be at hand at any time. So when wireless piconets become a commonplace and people carry multiple interoperable wireless devices, the ID information on the RFID token could be stored in each device owned by a particular user. Thus it would not be necessary for the user to carry around a particular token. In that case, the manufacturer of an appliance or a third party could simply provide the relay URL data and the relay server to customers or as a fee service.

The RFID token may be shipped with a new appliance and/or sold separately. Examples of appliances are telephones, televisions, computers, kitchen appliances, PDAs, movie boxes in hotel rooms, VCRs, or any device that can be customized. Appliances need not be owned by the user. For example a hotel or shopping mall video kiosk could make use of the token for self-customization allowing it to provide relevant advice to a traveler or shopper. Workers changing workstations could have the software of their workstations set themselves up according to the worker's preferences no matter where the worker moved in an office. The customizable features may consist of the location of icons on a desktop, the resolution of a screen, the settings of application software such as toolbars, background colors or any other persistent reset-able feature. Preference information may also cross boundaries so that a shopping mall kiosk could recommend fashion venues or restaurants based on television or movie preferences.

The token or device may simply be placed near the smart appliance while the user is using it. The device may be required to be placed close to the appliance or it could be permitted to work in a field that is a substantial radius, say several meters, as in a Bluetooth® network. One advantage that derives from a close-proximity requirement is that it allows users to enter and leave a user group by simply placing and removing the user's token. If the device is used in a physical setup where a user may leave the vicinity of the appliance for a period of time and then return and it might be disruptive to have the profile removed during that interval.

One way to get around the problem of leaving a the contact range of the appliance without leaving the group in a system using a large-radius RFID device is to provide in the programming of the appliance, a persistence period. When a user enters a group, the user's profile data is not added to the groups until he/she as remained in the group for a minimum period of time. After that initial interval, the user's presence is "persisted" (made permanent up to an interval) so that if the user leaves the room momentarily, his/her membership in the group is not lost. Also, to prevent transient occupants from being added to the user group, the detection of a token would not cause the addition of a user to a group unless confirmed or authenticated. Thus, the appliance could request confirmation that a new occupant confirm that he/she should be added to the user group.

Figure 5:
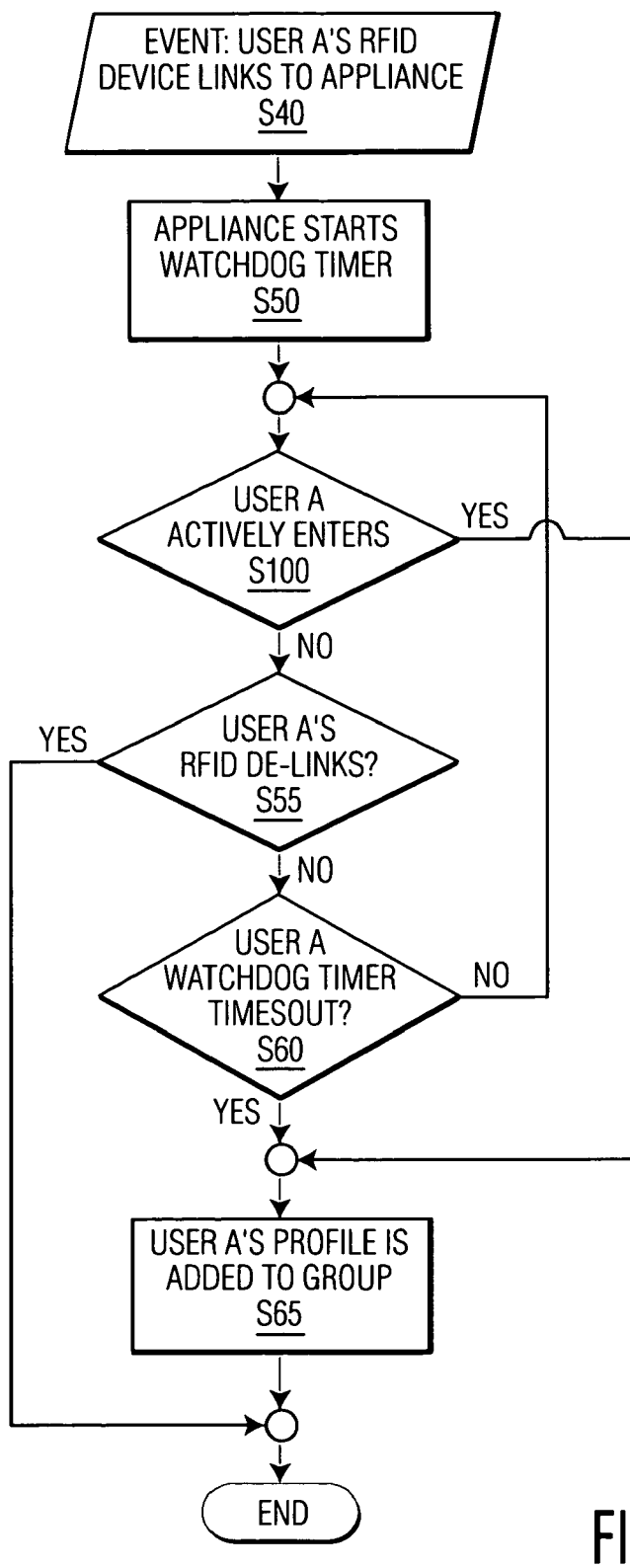
FIG. 5 is a flow chart indicating a procedure for adding a new user to a group of users according to an embodiment of the invention.

Referring to FIG. 5, when, in event S40, a User A's RFID links with an appliance in use by User's B and C, in step S50, the appliance starts a watchdog timer. In step S100, if User A actively enters the group, perhaps by clicking an icon on a television screen indicating that a new user is pending acceptance into the group, User A is added in step S65. Otherwise, in step S55 the link is tested to determine if User A remains linked. If User A has de-linked, he/she is removed from the pending list and the thread of FIG. 5 is terminated. If User A remains linked in step S55, the watchdog timer is tested in step S60. If the timer has timed out, control passes to step S65 and if not, control returns to step S100.

Figure 6:
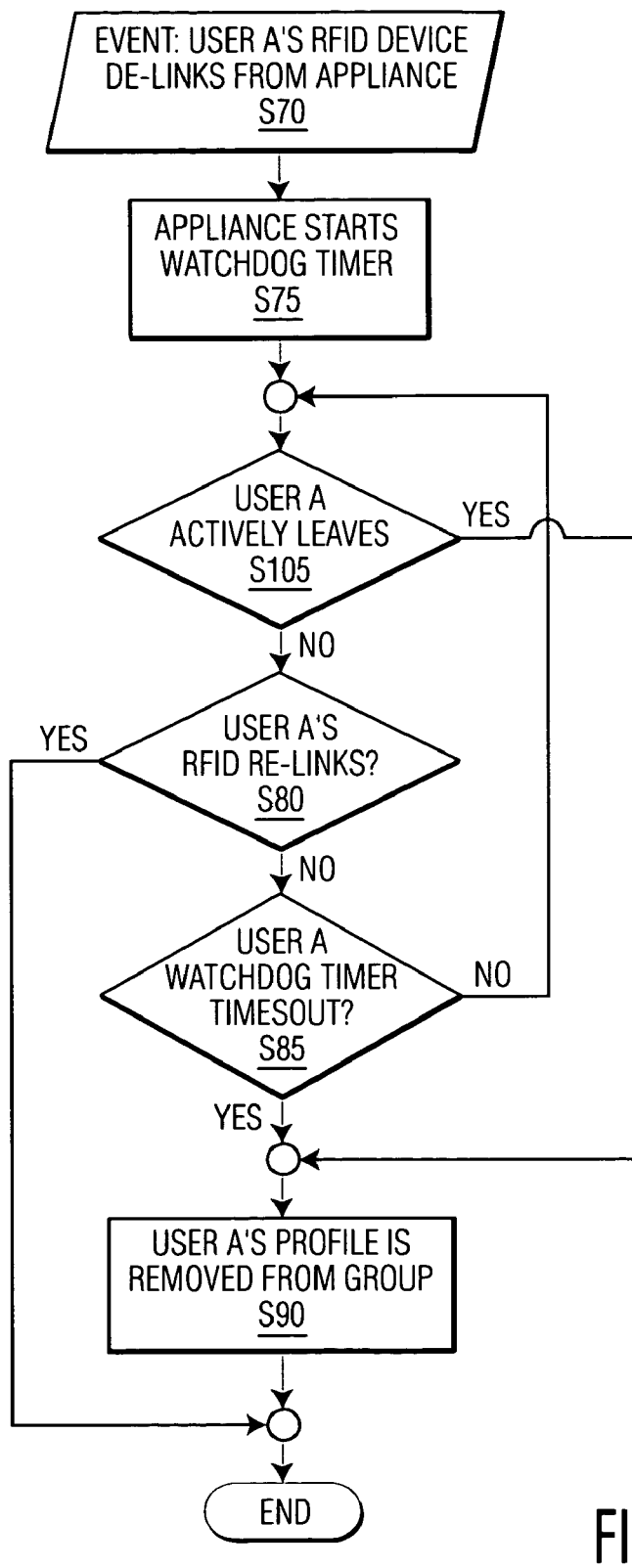
FIG. 6 is a flow chart indicating a procedure for removing a user from a group of users according to an embodiment of the invention.

Referring to FIG. 6, when, in event S70, User A's RFID de-links from an appliance in use by User's B and C, in step S75, the appliance starts a watchdog timer. In step S105, if User A actively leaves the group, perhaps by clicking an icon on a television screen indicating current members of the group, User A is removed from the group in step S90. Otherwise, in step S80 the link is tested to determine if User A has re-linked. If User A has re-linked, he/she remains in the current group and the thread of FIG. 6 is terminated. If User A remains unlinked in step S80, the watchdog timer is tested in step S85. If the timer has timed out, control passes to step S90 and if not, control returns to step S105.

Figure 7:
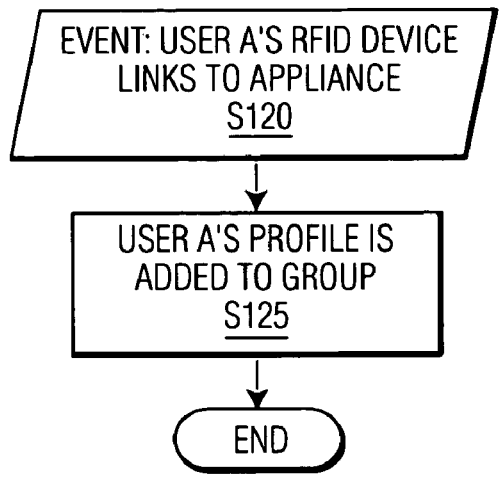
FIG. 7 is a flow chart indicating another procedure for adding a new user to a group of users according to an embodiment of the invention.
Figure 8:
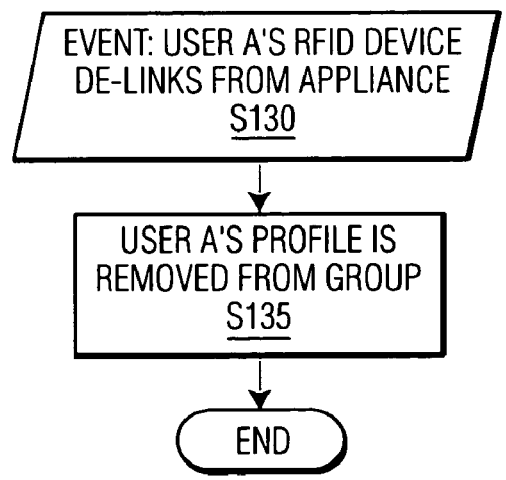
FIG. 8 is a flow chart indicating another procedure for removing a user from a group of users according to an embodiment of the invention.

Alternatively, the devices could be required to be placed right near the appliance. In this scenario, each user would leave his token or device on top of or near the appliance while he/she expected to remain an active member of a group of users. This would have the advantage of preventing inadvertent addition of transient occupants of the room being added to the user group. Referring to FIGS. 7 and 8, when a link is established, the user is in the group and when the link is broken, the user is removed from the group as indicated by events S120 and S130 and steps S125 and S135.

For security, the token may provide data identifying the token as well as the relay location URL and the smart appliance may be required to transmit this identifier in order to be authorized to receive data from either the relay server 310 or the profile server 305 or both. With this authorization requirement, if a user lost his/her RFID device, he/she could indicate the loss of the device to either the profile server administrator or the relay server administrator. Subsequent attempts to use the device could then be unauthorized.

Figure 9:
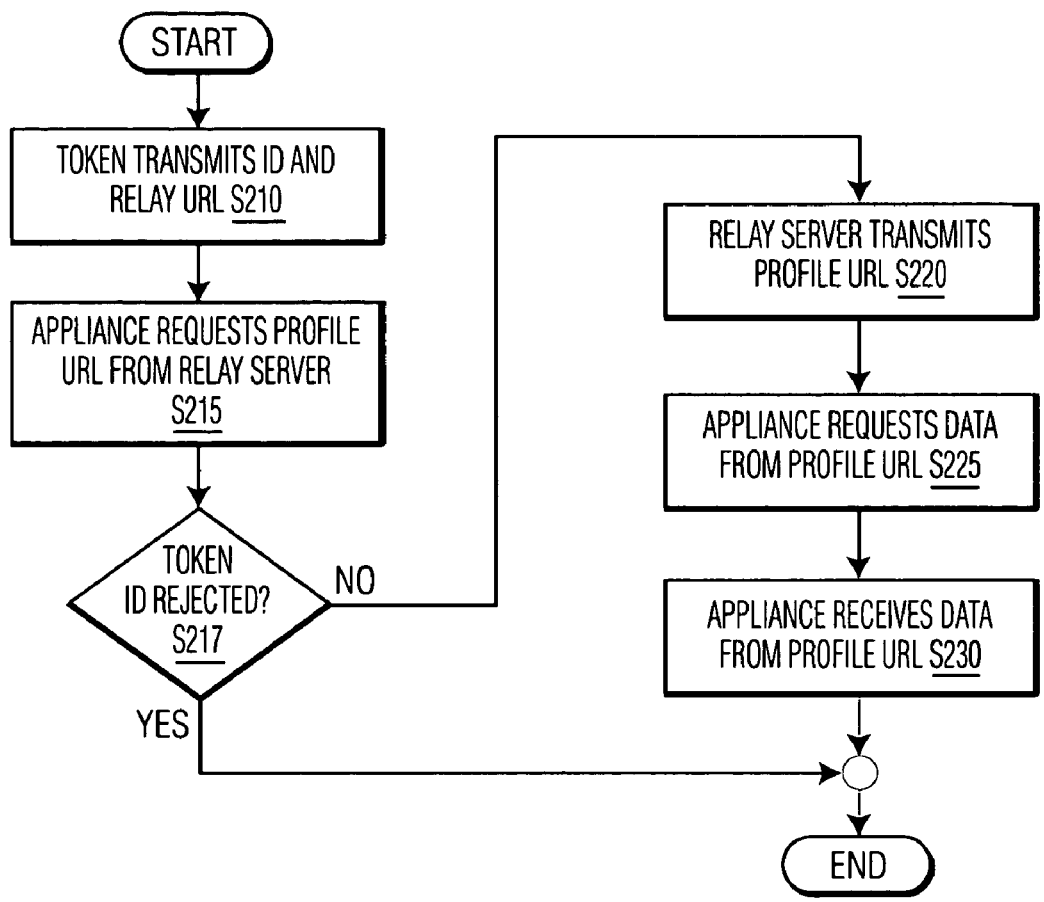
FIG. 9 is a flow chart indicating one type of secure procedure for accessing a user profile according to an embodiment of the invention.

Referring to FIG. 9, in step S210, the appliance 340 transmits the token ID and authentication data (for example a PIN code prompted by the appliance 340). Note that the authentication data may be left out, since the token ID may serve as the authentication. Then, in step S215 the appliance 340 requests the relay URL. In step S217, the relay server determines whether the request is valid or invalid and if valid, in step S220, transmits back to the appliance 340, the location of the profile data. If invalid, the thread terminates. In step S225, the appliance requests profile data from the profile server 305. Finally, in step 230, the profile data is returned.

Figure 10:
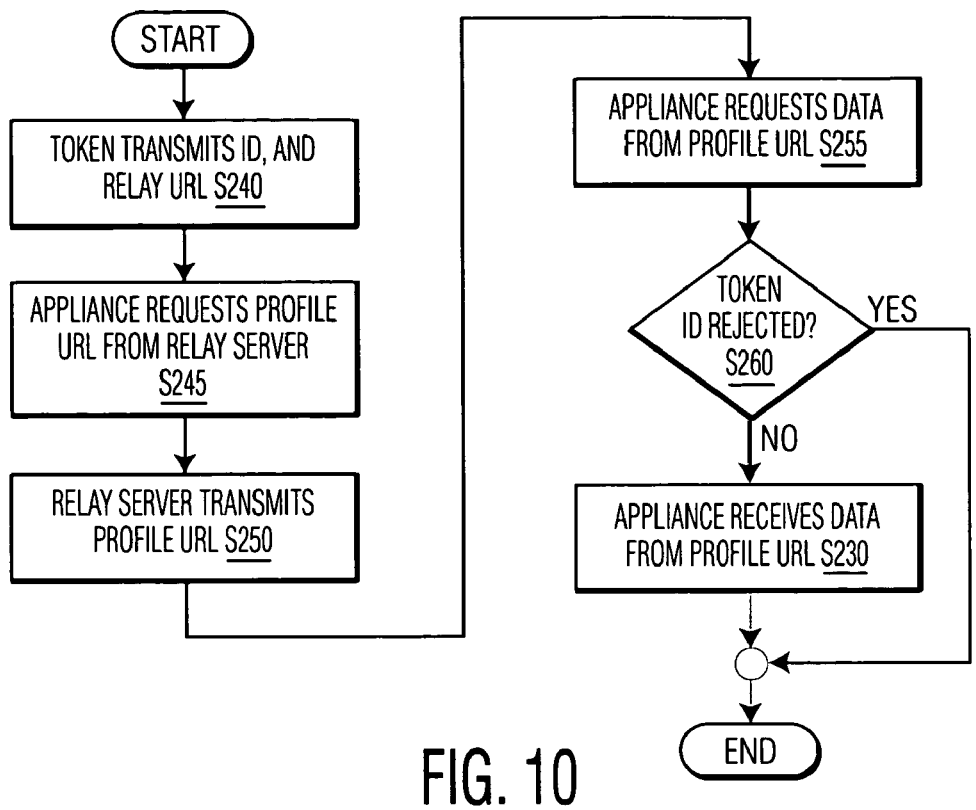
FIG. 10 is a flow chart indicating another type of secure procedure for accessing a user profile according to an embodiment of the invention.

Referring to FIG. 10, in step 240, the token transmits its ID and relay URL to the appliance 340. The appliance then transmits authentication data and the token ID to the relay server 310 at step S215. The relay server determines if the token is authorized at step S217 and if so, transmits the profile URL at step S220. If the token is not authorized, a rejection is transmitted and the thread is terminated. Then in steps S225 and S230, the profile data is transmitted to and received by, respectively, the appliance 340.

An example of a relay URL is:
http://123.123.123.123/tokens/<token ID>

Preferably this would link to a so-called dynamic web site that took in the token ID and ran an internal process that responded to it. In the above, the token ID and the URL are essentially the same, the former simply being passed to a server process as an argument within the rest of the URL. An example of a profile URL is: http://www.funpage.com/my-homepage/~joesmith/<password>/profile.dat. The latter URL contains a secret directory name which acts as a password so that it cannot be accessed idly. The data file could simply be downloaded by any appliance accessing it. Alternatively, the profile URL could point to a dynamic site that prompts an exchange. For example, such a site could request data identifying the type of appliance. A profile server process could use this information to transmit only the relevant data for the type of appliance. In addition, the user(s) may be prompted to enter a PIN number or some other authentication device to allow the profile to be used. The user may enter the authentication information on the appliance or via the RFID device itself. Thus, the tag could be provided with a small user interface allowing input and display of data.

When a token is lost, the relay URL could simply be discontinued for all time or reused by coupling it to a new secondary authentication tag.

Figure 11:
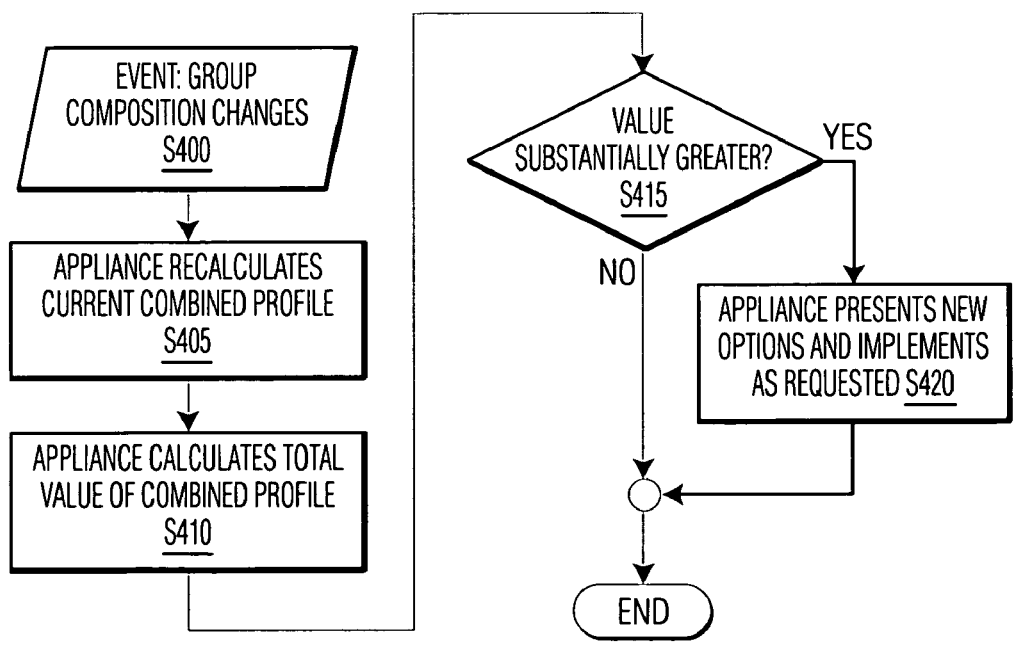
FIG. 11 is a flow chart indicating a procedure for providing new options to a group of users whose profile mix has changed.

As the constitution of a user group changes, the appliance may provide information about the combined profile so that the group can make adjustments or reconcile conflicts. The goodness of fit of available options to the groups preferences in combination can usually be determined, depending on the type of predictive engine being used. This topic is outside the scope of this patent, so it will not be discussed here. However, each combination of profiles would permit a unique set of options, each of whose combined value can be determined. Thus, a group of sports-lovers would achieve a higher total value in their most preferred set of choices than a group containing a mix of tastes. Referring to FIG. 11, when a group changes composition in step S400, the appliance 340 may recalculate the combined profile in step S405. In step S410, the value of the profile may be determined in step S410 and if greater than the value of the previous profile, in step S415, the appliance can present for selection the new set of options in step S420.

Figure 12:
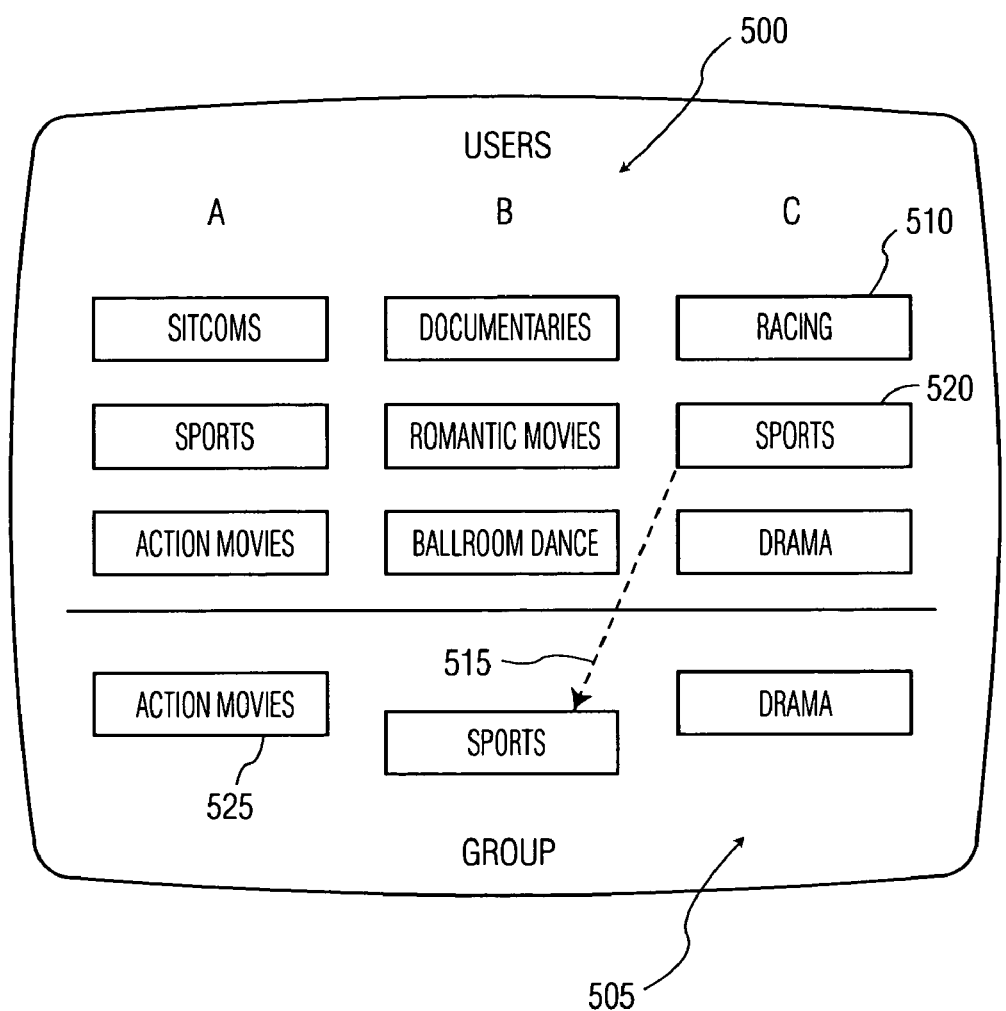
FIG. 12 is a flow chart illustrating a user interface for allowing a group to optimize a mix of profile data.

Profiles will inevitably contain imperfect information and methods for reconciling them may always be limited to some extent. Thus, for example, the non-presence of sitcoms in one user's profile could indicate indifference or antipathy. The mechanism for reconciling may be limited to simple logical operations such as union or intersection of sets of rules. Presenting feedback on the combined profile could allow the users to create a more intelligent reconciliation. Referring to FIG. 12, a user interface to support such an interactive reconciliation may display all the categories of favored material from the various profiles and allow the user(s) to select from among them. For example, in FIG. 11, a user interface displays categories 510 from each user's profile in a first area of a screen 500. In a second area 505, the interface displays selected categories 525 generated by combining group preferences. The group has selected one of the categories 520 to add to the group preferences as indicated by the arrow 515.

Combining profiles need not be a constant homogenized solution space. It is possible for a single group, which is planning to watch TV for a period of, say two hours, to compromise in a time-dependent way that maximizes the value for all members. Suppose the combination of profiles suggests highly preferred programming for one member or subgroup during the first hour and highly valued programming for another member or subgroup during the second hour. If the appliance knew the time during which the group would use the appliance together, it could make use of that information to allow selections to be made that would segregate the high value selections in time. The result would be that one member would get to see his/her most preferred programming during a first interval while another would get to see his/her most preferred programming during a second interval.

When a consumer buys an appliance, multiple RFID devices may be shipped with it. In a preferred embodiment, each of the RFID devices is shaped differently, like the pieces of a game, such as Monopoly®. That way, each member of a family can choose the piece that they identify with.

Alternatively, a single device may be shipped with a new appliance and further devices purchased when and if required. If the devices are to be used with multiple types of appliances or even multiple appliances made by multiple manufacturers, there may be a communications protocol standard that all would adopt. Alternatively, different protocols may be used by different manufacturers and each appliance built to recognize and interact with the devices of other manufacturers. If multiple devices are shipped with a product, to prevent wasted resources in the relay server, a user is required to register his/her device. The user logs onto the relay server, authorizes him/herself as a valid user, and enters the profile URL. The user can always change or update this URL, but the resources required for each user is very small so that many users can be serviced with a very small storage space. Also, to minimize contact with the relay server, appliances can be programmed to persist the profile data or the URL data for a period of time before the data is expired. Preferably this data is never revealed unless via a secure interface, so storage on the appliance should not present a privacy problem.

The invention contemplates a private profile database. According to one feature of the invention, each appliance may contribute information to this database. The prior art contains various descriptions of systems that adapt to user preferences by observing user-interaction with the appliance. For example by observing a user's programming choices over time, an EPG set top box can derive rules and use these to personalize the EPG in the future. This profile data may be uploaded by the appliance to the user's personal profile server. Preferably, the data format would be standardized across multiple classes of appliances, but this is not essential. For example, the data could be XML-tagged and stored ad hoc, allowing various devices to make sense of it through the tagging.

As described above, the invention provides, among other things, the ability to "move" profile or preference data among various appliances. It also provides the ability to associate the profile or preference data with a physical object rather than something that must be memorized, like a URL. It further provides a simple, fast, convenient mechanism for identifying a user without requiring data entry through a user interface. It still further provides the ability for an ad hoc group to be defined and indicated to an appliance and have multiple user profiles merged thereby. Still further, it provides the ability for a manufacturer to provide a key to the supporting service infrastructure without requiring the manufacturer to support the bulk of the necessary data. The latter feature has the advantage of permitting devices for making the user's data more secure and private.

According to another feature of the invention, a user interface allowing interaction with the profile server or an administrative server controlling data accessible via either or both, allows the user to correlate a particular subset of his/her profile data with a given RFID device. For example, the user may buy multiple RFID tokens. The user may wish to permit another person to have the user's personal telephone list. The user can, through a user interface of an administrator process running either on the relay server, the profile server or another server, associate the token with only that particular subset of his/her profile data. The administrator user interface would allow the entry of the token ID (either automatically or by entering a code associated with the ID effective to identify it uniquely). The user interface would permit the association of various permissions with the particular token. After doing so the administration process would configure a gate-keeping process that insured that only the specified data could be obtained from the profile using that particular token. The gate-keeping process may run for example on the relay server which indicates to the profile server that only a specified subset of data is authorized. Alternatively, the gate-keeping function may be provided on the profile server. Among the options provided by the administrative user interface could be a time-to-live parameter that makes a token unusable after a specified period of time.

Although the invention is discussed above with regard to, principally, an RFID tag or device, it is noted that any kind of data delivery device could be used. For example, the appliance user interface may be used to enter the relay URL manually or the URL could be stored on a smart card, bar code, or other means for transmitting data.

Note also that a feature of the invention is that the profile data on the profile server may include variegated preference data that includes data relating to various appliances and contexts. Thus the profile data may include software workstation environment preferences, telephone speed dial lists, PDA address and phone book entries, recipes, oven temperature settings, refrigerator settings, dishwasher washing modes, Internet site favorites, etc. These various data may be stored in a single corpus of preference data and accessed and administered by the same user interface.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method of controlling the operation of an appliance, the method comprising:
receiving, at the appliance, first access data from memory of a first remote device, the first access data providing network access to first configuration data corresponding to a first set of user preferences on an external network;
receiving at the appliance at least a portion of the first configuration data via the network access;
configuring the appliance to a first configuration in accordance with the at least a portion of the first configuration data;
receiving, at the appliance, second access data to the appliance from a memory of a second remote device, the second access data providing network access to second configuration data corresponding to a second set of user preferences on the external network;
receiving at the appliance at least a portion of the second configuration data via the network access; and
reconfiguring the appliance to a second configuration in accordance with the at least a portion of the second configuration data,
wherein:
receiving the at least the portion of the first configuration data includes:
receiving first relay data responsive to an external network server identified in the first access data, and
receiving the at least a portion of the first configuration data made accessible via the network access by the first relay data; and
receiving the at least the portion of the second configuration data includes:
receiving second relay data responsive to an external network server identified in the second access data, and receiving the at least a portion of the second configuration data made accessible via the network access by the second relay data, and wherein reconfiguring the appliance includes creating a composite of the portion of the first configuration data and the portion of the second configuration data.

2. The method of claim 1, wherein each of the first remote device and the second remote device corresponds to a portable device.

3. The method of claim 1, wherein each of the first and second remote devices corresponds to a radio frequency identification device.

4. The method of claim 3, wherein delivering the first and second access data includes co-locating the radio frequency identification device with the appliance.

5. The method of claim 1, wherein the first configuration data includes configuration data relating to the appliance and configuration data relating to another type of appliance.

6. The method of claim 1, wherein the first access data includes a Uniform Resource Locator (URL) associated with a relay server.

7. The method of claim 6, wherein the second access data includes an other Uniform Resource Locator (URL) associated with an other relay server.

8. A method of controlling the operation of an appliance, the method comprising:
   receiving, at the appliance, first access data from memory of a first remote device, the first access data providing network access to first configuration data corresponding to a first set of user preferences on an external network;
   receiving at the appliance at least a portion of the first configuration data via the network access;
   configuring the appliance to a first configuration in accordance with the at least a portion of the first configuration data;
   receiving, at the appliance, second access data to the appliance from a memory of a second remote device, the second access data providing network access to second configuration data corresponding to a second set of user preferences on the external network;
   receiving at the appliance at least a portion of the second configuration data via the network access; and
   reconfiguring the appliance to a second configuration in accordance with the at least a portion of the second configuration data,
   wherein:
   receiving the at least the portion of the first configuration data includes:
      receiving first relay data responsive to an external network server identified in the first access data, and
      receiving the at least a portion of the first configuration data made accessible via the network access by the first relay data; and
   receiving the at least the portion of the second configuration data includes:
      receiving second relay data responsive to an external network server identified in the second access data, and
      receiving the at least a portion of the second configuration data made accessible via the network access by the second relay data,
   wherein each of the first and second remote devices corresponds to a radio frequency identification device,
   wherein delivering the first and second access data includes co-locating the radio frequency identification device with the appliance,
   and wherein the method further comprises:
   reconfiguring the appliance to the first configuration after removal of the second remote device from a vicinity of the appliance.

9. The method of claim 8, further including measuring a time duration after the removal of the second remote device, and wherein reconfiguring the appliance to the first configuration occurs when the time duration exceeds a predefined persistence period.

* * * * *